(12) United States Patent
Meisel et al.

(10) Patent No.: US 8,607,632 B2
(45) Date of Patent: Dec. 17, 2013

(54) MICROMECHANICAL SENSOR

(75) Inventors: Daniel Christoph Meisel, Vaihingen An Der Enz (DE); Joerg Hauer, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 272 days.

(21) Appl. No.: 13/057,045

(22) PCT Filed: Aug. 3, 2009

(86) PCT No.: PCT/EP2009/060019
§ 371 (c)(1),
(2), (4) Date: May 10, 2011

(87) PCT Pub. No.: WO2010/034550
PCT Pub. Date: Apr. 1, 2010

(65) Prior Publication Data
US 2011/0219877 A1  Sep. 15, 2011

(30) Foreign Application Priority Data
Sep. 25, 2008 (DE) .......................... 10 2008 042 351

(51) Int. Cl.
G01P 15/125 (2006.01)
G01P 1/02 (2006.01)
G01C 19/56 (2012.01)

(52) U.S. Cl.
USPC .................. 73/514.32; 73/493; 73/504.12

(58) Field of Classification Search
USPC .................. 73/514.32, 514.36, 514.38, 493, 73/504.12, 504.14, 504.16
See application file for complete search history.

(56) References Cited

U.S. PATENT DOCUMENTS

| 6,536,281 B2* | 3/2003 | Abe et al. ................... 73/504.16 |
| 6,953,993 B2* | 10/2005 | Yamaguchi ................... 257/704 |
| 7,533,570 B2* | 5/2009 | Yamaguchi et al. ........ 73/514.32 |
| 2001/0032508 A1 | 10/2001 | Lemkin et al. |
| 2002/0073780 A1 | 6/2002 | Katsumata |
| 2003/0183009 A1* | 10/2003 | An et al. .................... 73/514.16 |
| 2008/0100175 A1* | 5/2008 | Clark ............................ 310/309 |

FOREIGN PATENT DOCUMENTS

| EP | 1 118 836 | 7/2001 |
| JP | 2007 080985 | 3/2008 |

* cited by examiner

Primary Examiner — Helen Kwok
(74) Attorney, Agent, or Firm — Kenyon & Kenyon LLP

(57) ABSTRACT

A micromechanical sensor having at least one movably mounted measuring element which is opposite at least one stationary electrode, the electrode being situated in a first plane, and being contacted by at least one printed conductor track which is situated in a second plane. A third plane is located between the first plane and the second plane, the third plane including an electrically conductive material.

7 Claims, 1 Drawing Sheet

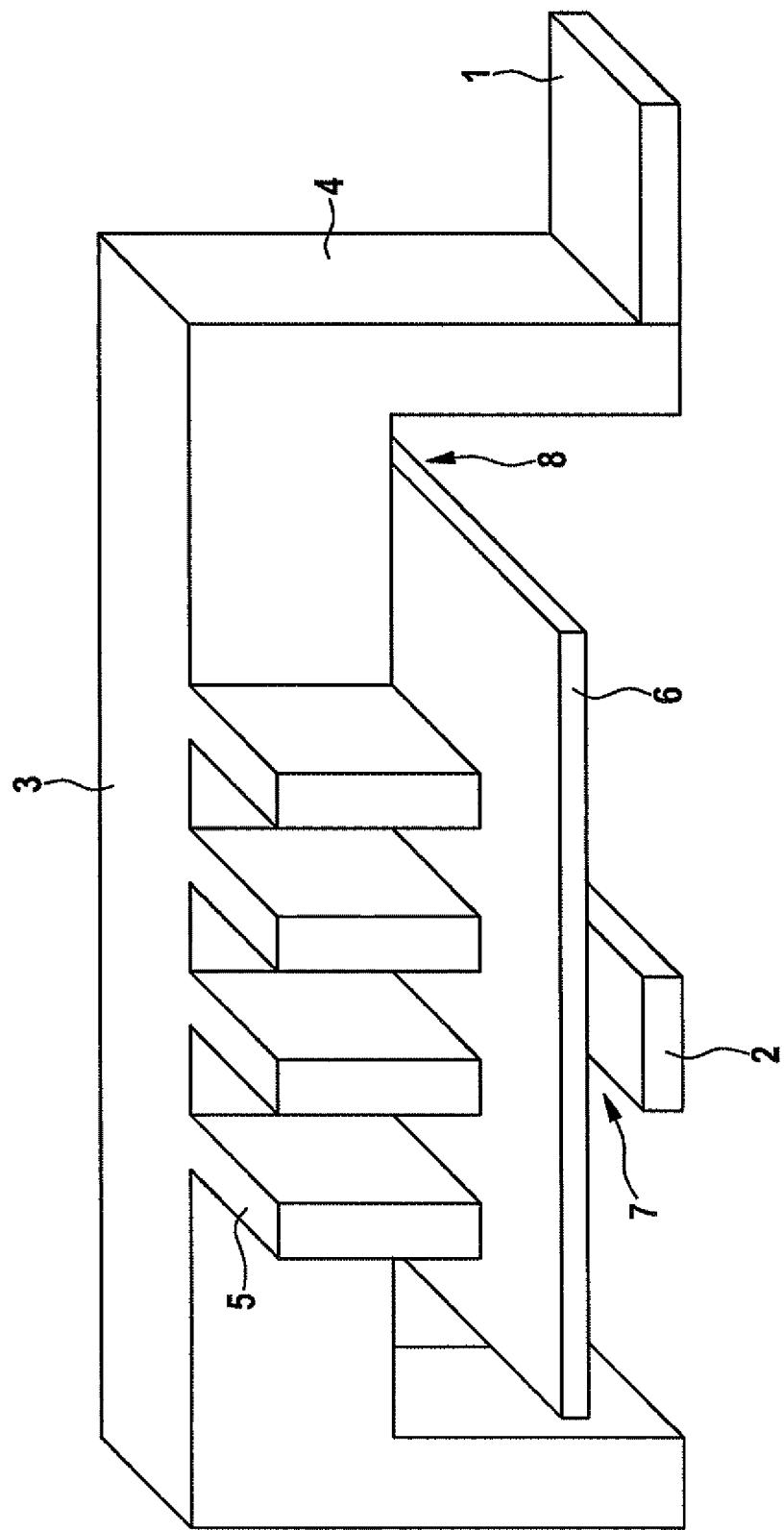

MICROMECHANICAL SENSOR

FIELD OF THE INVENTION

The present invention relates to a micromechanical sensor having at least one movably mounted measuring element which is opposite at least one stationary electrode, the electrode being situated in a first plane and being contacted by at least one printed conductor track which is situated in a second plane.

BACKGROUND INFORMATION

Micromechanical sensors are used for detecting movement, for example for triggering safety devices of motor vehicles. For this purpose, a movably mounted measuring element is provided which is spring mounted. Such a measuring element may be manufactured, for example, from a semiconductor material using an etching method. The movement of such a measuring element may be detected capacitively. Conductive electrodes which are connected via printed conductor tracks having bond pads are provided for this purpose. The electrodes may be connected to measuring electronics or a connecting contact of a housing via the bond pads. To save chip surface, it is known to route the printed conductor tracks and the electrodes on different planes within the sensor. Both planes in this case are separated from one another by an insulating layer.

A disadvantage of this related art is, however, the fact that printed conductor tracks may be coupled to one another capacitively on different planes. As a result, the signals in one printed conductor track may interfere with the signal in another printed conductor track. For that reason, crossings or parallel routings of printed conductor tracks on different planes are normally avoided, which again increases the required chip surface.

Proceeding from this related art, an object of the present invention is to provide an improved micromechanical sensor, the electrical signals of which have a higher signal quality.

SUMMARY OF THE INVENTION

According to the present invention, the objective is achieved by a micromechanical sensor having at least one movably mounted measuring element. The measuring element is opposite at least one stationary electrode, the electrode being situated in a first plane and being contacted by at least one printed conductor track which is situated in a second plane. According to the present invention, a third plane which includes an electrically conductive material is located between the first plane and the second plane.

According to the present invention, a conductive intermediate plane is positioned between two signal conductors, the intermediate plane having a low-resistance connection to a predefinable potential during operation of the micromechanical sensor. In particular, the third conductive plane has a low-resistance connection to a ground potential. As a result, the material of the third plane acts as a shield which prevents crosstalk of signals of printed conductor tracks which are situated one over the other.

For this purpose, the third plane contains an electrically conductive material, for example a metal or an alloy. It is preferred in particular that the third plane contains a polycrystalline silicon. It may in addition be provided with a doping substance. In particular, the doping substance includes gallium, boron, aluminum, nitrogen, phosphorous or arsenic.

To avoid a short circuit between conductive elements of the first, second and third plane, a refinement of the present invention may provide insulating layers between the conductive elements. These include in particular a silicon oxide, a silicon nitride or a silicon oxynitride. Such oxide layers may, for example, be produced by a thermal treatment of a silicon material in a reactive atmosphere. In another specific embodiment of the present invention, the oxide layers may be deposited from a plasma-activated gas phase from layer-forming substances. In another specific embodiment, the insulating layers may also be produced using a sol-gel process.

In one refinement of the present invention, the material of the third plane may be used as an etching stop layer during the manufacture of the micromechanical sensor. Such an etching stop layer is not attacked by an etching chemical and thus prevents the structures lying under it from being damaged while structures are produced above the etching stop layer. After the micromechanical sensor is completed, the etching stop layer is then used during operation as a shield for preventing crosstalk between printed conductor tracks.

BRIEF DESCRIPTION OF THE DRAWING

FIG. 1 shows a detail of a structure of a micromechanical sensor provided according to the present invention.

DETAILED DESCRIPTION

FIG. 1 shows a three-dimensional representation of several structures of a sensor according to the present invention. A first printed conductor track 1 and a second printed conductor track 2 are represented. Both printed conductor tracks are located in a second plane. The second plane may be situated, for example, on the surface of a semiconductor substrate which is not shown.

The semiconductor substrate is made, for example, from a silicon material. The substrate may have a doping or a structuring for implementing predefinable functions. If the substrate is conductive, an insulation layer, for example a silicon oxide, may be located between the substrate surface and printed conductor tracks 1 and 2. Such an insulation layer may, for example, have a thickness of approximately 1 μm to approximately 3 μm.

Printed conductor tracks 1 and 2 may, for example, be made from a polycrystalline silicon material, which includes a doping substance. Printed conductor tracks 1 and 2 may have a thickness of approximately 200 nm to approximately 1000 nm. Printed conductor tracks 1 and 2 may be provided by all-over deposition of the silicon material and subsequent structuring and etching.

A first plane including an electrode 3 is located above the second plane having printed conductor tracks 1 and 2. Electrode 3 may also be manufactured from a conductive material, for example a metal, an alloy or a polycrystalline silicon. Preferably the first plane also contains the movable measuring element (not shown) adjacent to electrode 3. For that reason, the first plane and electrode 3 have a thickness which is predefined by the size of the movably mounted measuring element. In particular, the thickness is approximately 5 μm to approximately 50 μm.

Stationary electrode 3 may in addition have finger electrodes 5 which engage with correspondingly formed finger electrodes of the movably mounted measuring element. The measuring accuracy of the micromechanical sensor is increased in this way.

Printed conductor track 1 is available for the electrical contacting of electrode 3. Since printed conductor track 1 is situated on the second plane while electrode 3 is located on the first plane, the electrical contact is produced via a vertical shaft 4.

Electrode 3 may, for example, be used for the capacitive distance measurement between the movably mounted measuring element and stationary electrode 3. In this manner, the movably mounted measuring element may be used for implementing an acceleration sensor.

In another specific embodiment of the present invention, an alternating voltage may be applied to electrode 3 via printed conductor track 1 and shaft 4. Such an alternating voltage produces an alternating field in which the movably mounted measuring element vibrates. If such a vibrating measuring element is exposed to a rotation, the Coriolis force acting on the measuring element causes the measuring element to be deflected, making it possible to implement a yaw rate sensor.

The sensor shown in FIG. 1 includes a second printed conductor track 2. This second printed conductor track may contact a second electrode which is not shown. In particular, the second electrode may be one which detects the deflection of the measuring element in a second spatial direction or an additional electrode which detects the deflection of a second measuring element on the same semiconductor substrate. Printed conductor track 2 crosses electrode 3 having finger electrodes 5 situated on it. In particular, if an alternating voltage is applied to electrode 3 in order to cause the measuring element to vibrate, electrode 3 emits a comparatively strong electromagnetic alternating field. According to the related art, this alternating field would couple into printed conductor track 2.

To reduce the capacitive coupling between electrode 3 and printed conductor track 2, the present invention provides a conductive layer 6 in a third plane. The third plane lies between the first plane having electrode 3 and the second plane having printed conductor tracks 1 and 2. Conductive layer 6 in the third plane may also include, for example, a metal, an alloy or a polycrystalline silicon. Conductive layer 6 preferably includes a material which is not attacked by the compound used for etching in an etching process for structuring electrode 3 and finger electrodes 5. In this manner, conductive layer 6 may be used to protect printed conductor track 2 during the manufacture of electrode 3 and finger electrodes 5.

When the micromechanical sensor is operated, conductive layer 6 is connected at low resistance to a predefinable potential, in particular a ground potential. In this manner, a Faraday cage is formed under conductive layer 6, the Faraday cage keeping the signals emitted by electrode 3 away from printed conductor track 2. In the same manner, a Faraday cage is formed above conductive layer 6, the Faraday cage keeping the interference radiation emitted by printed conductor track 2 away from electrode 3. In this manner, the signal-to-noise ratio of the signals of both electrode 3 and printed conductor track 2 are increased as desired.

In the same manner as described above for printed conductor tracks, shield 6 according to the present invention may also be used to suppress the force effect exerted by a printed conductor track on the movable measuring element.

To avoid an electric short circuit between printed conductor track 2, conductive layer 6 and electrode 3, an insulating material is located in intermediate space 7 between printed conductor track 2 and electrically conductive layer 6 as well as in intermediate space 8 between layer 6 and electrode 3. For the purposes of the present invention, an insulating material may also be a dielectric, in particular. It is preferred but not mandatory for the dielectric to include a silicon oxide. The silicon oxide may be manufactured, for example, by thermal oxidation of a silicon layer. In another specific embodiment of the present invention, the silicon oxide may be produced using a sol-gel process. Tetraethoxysilane, for example, is suitable as a precursor. In another specific embodiment of the present invention, a dielectric may be deposited from a plasma-activated gas phase. A CVD or a PVD process is in particular suitable for this.

One skilled in the art is of course aware that the present invention is not limited to the exemplary embodiment shown, but instead modifications and changes may be made in implementing the present invention without materially changing the invention. The foregoing description is therefore not to be seen as limiting but instead as elucidating.

What is claimed is:

1. A micromechanical sensor comprising:
   At least one stationary electrode situated in a first plane;
   At least one movably mounted measuring element situated opposite the stationary electrode;
   At least one printed conductor track situated in a second plane and contacting the stationary electrode;
   At least one printed conductor track situated in the second plane and crossing the stationary electrode situated in the first plane; and
   An electrically conductive material situated in a third plane, the third plane being situated between the first plane and the second plane, the electrically conductive material forming a Faraday cage between the stationary electrode and the printed conductor track crossing the stationary electrode.

2. The micromechanical sensor according to claim 1, wherein the first, the second, and the third planes are separated from one another by insulating layers.

3. The micromechanical sensor according to claim 1, wherein at least one of the first plane, the second plane, and the third plane contains a polycrystalline silicon.

4. The micromechanical sensor according to claim 1, wherein a material of the third plane is not attacked in a gas-phase etching process.

5. The micromechanical sensor according to claim 1, further comprising a finger electrode situated in the first plane.

6. The micromechanical sensor according to claim 1, wherein the micromechanical sensor is an acceleration sensor.

7. The micromechanical sensor according to claim 1, wherein the micromechanical sensor is a yaw rate sensor.

* * * * *

UNITED STATES PATENT AND TRADEMARK OFFICE
CERTIFICATE OF CORRECTION

PATENT NO. : 8,607,632 B2
APPLICATION NO. : 13/057045
DATED : December 17, 2013
INVENTOR(S) : Meisel et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 318 days.

Signed and Sealed this
Twenty-second Day of September, 2015

Michelle K. Lee
*Director of the United States Patent and Trademark Office*